US010068976B2

(12) United States Patent
Yeh et al.

(10) Patent No.: US 10,068,976 B2
(45) Date of Patent: Sep. 4, 2018

(54) ENHANCEMENT MODE FIELD-EFFECT TRANSISTOR WITH A GATE DIELECTRIC LAYER RECESSED ON A COMPOSITE BARRIER LAYER FOR HIGH STATIC PERFORMANCE

(71) Applicant: Taiwan Semiconductor Manufacturing Co., Ltd., Hsin-Chu (TW)

(72) Inventors: Chia-Ling Yeh, Jhubei (TW); Man-Ho Kwan, Kowloon (HK); Kuei-Ming Chen, New Taipei (TW); Jiun-Lei Jerry Yu, Zhudong Township (TW); Chun Lin Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/215,625

(22) Filed: Jul. 21, 2016

(65) Prior Publication Data
US 2018/0026106 A1 Jan. 25, 2018

(51) Int. Cl.
| | |
|---|---|
| *H01L 29/15* | (2006.01) |
| *H01L 29/40* | (2006.01) |
| *H01L 29/20* | (2006.01) |
| *H01L 29/205* | (2006.01) |
| *H01L 29/778* | (2006.01) |
| *H01L 29/66* | (2006.01) |
| *H01L 27/06* | (2006.01) |
| *H01L 21/8252* | (2006.01) |

(52) U.S. Cl.
CPC ........ *H01L 29/408* (2013.01); *H01L 21/8252* (2013.01); *H01L 27/0605* (2013.01); *H01L 29/2003* (2013.01); *H01L 29/205* (2013.01); *H01L 29/66462* (2013.01); *H01L 29/7787* (2013.01)

(58) Field of Classification Search
CPC ........... H01L 29/66462; H01L 29/7786; H01L 29/205; H01L 29/42316; H01L 29/432; H01L 29/7787
See application file for complete search history.

(56) References Cited

U.S. PATENT DOCUMENTS

2006/0121658 A1* 6/2006 Ahn .................. H01L 29/66462
438/167
2008/0296618 A1* 12/2008 Suh ..................... H01L 29/1066
257/190

(Continued)

Primary Examiner — Frederick B Hargrove
(74) Attorney, Agent, or Firm — Eschweiler & Potashnik, LLC

(57) ABSTRACT

An enhancement mode field-effect transistor (E-FET) for high static performance is provided. A composite barrier layer comprises a lower barrier layer and an upper barrier layer. The upper barrier layer is arranged over the lower barrier layer and has a different polarization than the lower barrier layer. Further, the composite barrier layer comprises a gate opening. A channel layer is arranged under the composite barrier layer, such that a heterojunction is defined at an interface between the channel layer and the composite barrier layer. A gate dielectric layer is arranged over the composite barrier layer and within the gate opening. A gate electrode is arranged over the gate dielectric layer. A method for manufacturing the E-FET is also provided.

20 Claims, 7 Drawing Sheets

(56) References Cited

U.S. PATENT DOCUMENTS

| | | | | |
|---|---|---|---|---|
| 2009/0146185 A1* | 6/2009 | Suh | .................... | H01L 29/2003 |
| | | | | 257/194 |
| 2011/0241020 A1* | 10/2011 | Saunier | .............. | H01L 21/8252 |
| | | | | 257/77 |
| 2011/0303952 A1* | 12/2011 | Hwang | ................. | H01L 29/267 |
| | | | | 257/194 |
| 2012/0161153 A1* | 6/2012 | Yumoto | .............. | H01L 29/4236 |
| | | | | 257/76 |
| 2013/0248878 A1* | 9/2013 | Jang | ................. | H01L 29/66462 |
| | | | | 257/76 |
| 2013/0313561 A1* | 11/2013 | Suh | ....................... | H01L 29/402 |
| | | | | 257/76 |
| 2013/0341595 A1* | 12/2013 | Lee | .................... | H01L 29/1075 |
| | | | | 257/24 |
| 2014/0001478 A1* | 1/2014 | Saunier | ............ | H01L 29/66462 |
| | | | | 257/76 |
| 2016/0172455 A1* | 6/2016 | Kikkawa | ............ | H01L 29/7786 |
| | | | | 257/76 |
| 2016/0300835 A1* | 10/2016 | Xia | .................... | H01L 29/4236 |

\* cited by examiner

US 10,068,976 B2

ENHANCEMENT MODE FIELD-EFFECT TRANSISTOR WITH A GATE DIELECTRIC LAYER RECESSED ON A COMPOSITE BARRIER LAYER FOR HIGH STATIC PERFORMANCE

BACKGROUND

Semiconductor devices based on silicon have been the standard for the past few decades. However, semiconductor devices based on alternative materials are receiving increasing attention for advantages over silicon-based semiconductor devices. For example, semiconductor devices based on group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
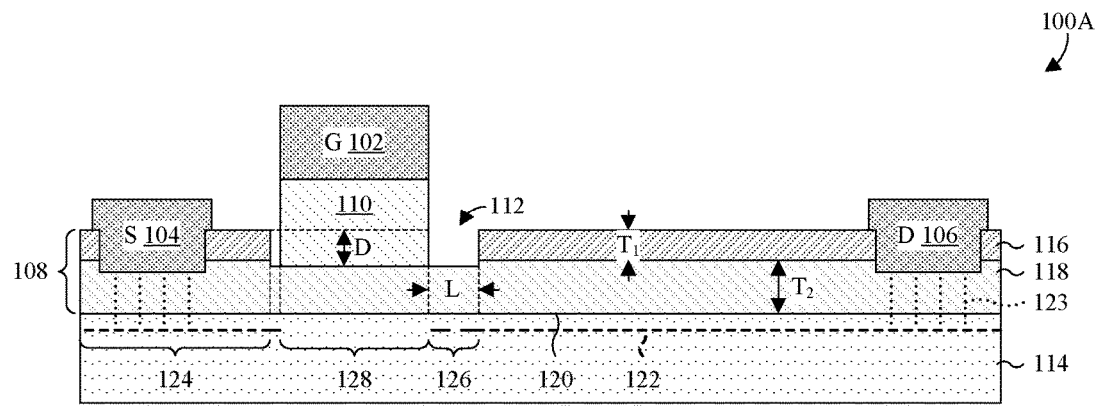
FIG. 1A illustrates a cross-sectional view of some embodiments of an enhancement mode field-effect transistor (E-FET) for high static performance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some enhancement mode field-effect transistors (E-FETs) comprise a barrier layer arranged over and contacting a channel layer. The barrier layer and the channel layer define a two-dimensional electron gas (2-DEG) in the channel layer, along a heterojunction at an interface between the barrier and channel layers. The barrier layer may be, for example, a single-layer film. Alternatively, the barrier layer may be, for example, a multi-layer film comprising an upper barrier layer overlying a lower barrier layer with a lower polarization. A gate electrode is arranged over and spaced from the barrier layer by a gate dielectric layer. The gate dielectric layer is a group III nitride with a p-type doping, such that the gate dielectric layer depletes the 2-DEG immediately under the gate dielectric layer. Further, the gate dielectric layer has a bottom surface arranged over a top surface of the barrier layer.

A challenge with the E-FETs is a trade-off between threshold voltage and static on resistance. Adjusting the barrier layer to increase threshold voltage increases static on resistance, and adjusting the barrier layer to decrease static on resistance decreases threshold voltage. The barrier layer may, for example, be adjusted to increase or decrease threshold voltage respectively by decreasing or increasing polarization of the barrier layer.

The present application is directed towards some embodiments of an E-FET for high static performance. In some embodiments, a composite barrier layer comprises a lower barrier layer and an upper barrier layer, wherein the upper barrier layer is arranged over the lower barrier layer and has a different polarization than the lower barrier layer. Further, the composite barrier layer comprises a gate opening. A channel layer is arranged under the composite barrier layer, such that a heterojunction is defined at an interface between the channel layer and the composite layer. A gate dielectric layer is arranged over the composite barrier layer and within the gate opening, and a gate electrode is arranged over the gate dielectric layer. In some embodiments, the gate dielectric layer and the gate electrode are laterally offset away from a drain side of the gate opening.

The gate opening advantageously reduces the electron density of the 2-DEG immediately under the gate opening, relative to the electron density of the 2-DEG laterally adjacent to the gate opening. As such, the dependence between threshold voltage and static on resistance is reduced, and the E-FET may have a high threshold voltage while also having a low static on resistance.

With reference to FIG. 1A, a cross-sectional view 100A of some embodiments of an E-FET for high static performance is provided. As illustrated, a gate electrode 102 is laterally spaced from a source electrode 104 and a drain electrode 106, and is vertically spaced over a composite barrier layer 108 by a gate dielectric layer 110. In some embodiments, the gate electrode 102 is spaced farther from the drain electrode 106 than the source electrode 104. The source and drain electrodes 104, 106 are arranged respectively on opposite sides of the gate electrode 102. Further, the source and drain electrodes 104, 106 are arranged over the composite barrier layer 108 and, in some embodiments, extend into and/or contact the composite barrier layer 108. The gate, source, and drain electrodes 102, 104, 106 are conductive and may be, for example, aluminum copper, tungsten, copper, or doped polysilicon.

The gate dielectric layer 110 is arranged in a gate opening 112 of the composite barrier layer 108, such that a bottom surface of the gate dielectric layer 110 is recessed below a top surface of the composite barrier layer 108. Advantageously, such recessing may result in a threshold voltage of the E-FET that is high. In some embodiments, sidewalls of the gate dielectric layer 110 are laterally spaced from sidewalls of the gate opening 112, and/or a bottom surface of the gate dielectric layer 110 contacts a bottom surface of the gate opening 112. For example, a sidewall of the gate dielectric layer 110 may be laterally spaced from a drain-side sidewall of the gate opening 112 by a lateral distance L. Further, in some embodiments, the gate dielectric layer 110 is a group III nitride and/or doped with p-type or n-type dopants. For example, the gate dielectric layer 110 may be p-type gallium nitride (p-GaN). Advantageously, varying properties of the gate dielectric layer 110 may vary the threshold voltage. Such properties may include, for example, material and/or doping concentration.

The composite barrier layer 108 is arranged over a channel layer 114, and comprises an upper barrier layer 116 and a lower barrier layer 118. The upper and lower barrier layers 116, 118 are stacked with the upper barrier layer 116 overlying and, in some embodiments, contacting the lower barrier layer 118. Further, the upper barrier layer 116 and, in some embodiments, the lower barrier layer 118 accommodate the gate opening 112, such that the gate opening 112 extends into the composite barrier layer 108 to a depth D. For example, the gate opening 112 may be arranged in both the upper and lower barrier layers 116, 118, such that the bottom surface of the gate opening 112 may be recessed below a top surface of the lower barrier layer 118. As another example, the gate opening 112 may be arranged solely within the upper barrier layer 116, such that the bottom surface of the gate opening 112 may be defined by the top surface of the lower barrier layer 118 or may be spaced over the top surface of the lower barrier layer 118. Advantageously, varying the depth D of the gate opening 112 may vary the threshold voltage with minimal impact on a static on resistance of the E-FET.

The upper and lower barrier layers 116, 118 are individually polarized, such that positive charge is shifted towards lower or bottom surfaces of the upper and lower barrier layers 116, 118 and negative charge is shifted towards upper or top surfaces of upper and lower barrier layers 116, 118. The polarization may be induced by, for example, spontaneous polarization effects and/or piezoelectric polarization effects. Further, the upper and lower barrier layers 116, 118 have different polarizations and, in some embodiment, respective thicknesses $T_1$, $T_2$ that are uniform. For example, the upper barrier layer 116 may have a higher polarization than the lower barrier layer 118. Advantageously, varying the polarizations and/or the thicknesses $T_1$, $T_2$ may vary the static on resistance. In some embodiments, the upper and lower barrier layers 116, 118 are compounds of the same elements, but with different ratios of the elements, and/or are group III-V nitrides or some other group III-V compounds. For example, the upper and lower barrier layers 116, 118 may respectively be $In_wAl_xG_{1-x-w}N$ and $In_yAl_zG_{1-y-z}N$, where w, x, y, and z are each between 0 and 1. As another example, the upper and lower barrier layers 116, 118 may comprise group III-V compounds with different elements. Further, in some embodiments, the upper and lower barrier layers 116, 118 are undoped.

The channel layer 114 contacts the composite barrier layer 108 with a band gap unequal to that of the lower barrier layer 118 and, in some embodiments, the upper barrier layer 116, such that a heterojunction 120 is arranged at an interface with the composite barrier layer 108. The heterojunction 120 facilitates the transfer of electrons to or from a 2-DEG 122 in the channel layer 114 respectively from or to the composite barrier layer 108. In some embodiments, the channel layer 114 is a group III-V material and/or is undoped. For example, the channel layer 114 may be undoped gallium nitride (u-GaN).

The 2-DEG 122 electrically couples the source and drain electrodes 104, 106 together depending upon a bias applied to the gate electrode 102 and, in some embodiments, is ohmically coupled with the source and drain electrodes 104, 106. For ease of illustration, dotted lines 123 are employed to represent such ohmic coupling. When the bias exceeds the threshold voltage, such that the E-FET is in an on state, the 2-DEG 122 electrically couples the source and drain electrodes 104, 106. When the bias is less than the threshold voltage, such that the E-FET is in an off state, the 2-DEG 122 electrically isolates the source and drain electrodes 104, 106. In some embodiments, the 2-DEG 122 comprises a first region 124 with a first electron density laterally adjacent to the gate opening 112, a second region 126 with a second electron density immediately under the gate opening 112 and laterally adjacent to the gate dielectric layer 110, and a third region 128 with a third electron density immediately under the gate dielectric layer 110 and the gate opening 112. For ease of illustration, only one side of the first region 124 and only one side of the second region 126 are labeled.

In the off state of the E-FET, the first electron density is high compared to the second electron density, such that the first region 124 of the 2-DEG 122 has a low resistance compared to the second region 126 of the 2-DEG 122. Further, the third electron density is low compared to the second electron density, such that the third region 128 of the 2-DEG 122 does not conduct. In the on state of the E-FET, the bias applied to the gate electrode 102 increases the first, second, and third electron densities, such that the third region 128 of the 2-DEG 122 conducts. The increases are weighted in favor of the second and/or third regions 126, 128 of the 2-DEG 122, compared to the first region 124 of the 2-DEG 122, due to closer proximity to the gate electrode 102. Further, the extent of the increases varies in proportion to the extent of the bias applied to the gate electrode 102.

Advantageously, arranging the gate dielectric layer 110 in the gate opening 112 reduces the polarization of the composite barrier layer 108 at the second and third regions 126, 128 of the 2-DEG 122, compared to the first region 124 of the 2-DEG 122, such that the threshold voltage may be high. Further, the depth D of the gate opening 112 advantageously allows control over the threshold voltage. For example, increasing the depth D of the gate opening 112 may increase the threshold voltage and decreasing the depth D of the gate opening 112 may decrease the threshold voltage.

Further, the gate opening 112 reduces the polarization of the composite barrier layer 108 at the second and third regions 126, 128 of the 2-DEG 122 in a manner that does not affect the polarization of the composite barrier layer 108 at the first region 124 of the 2-DEG 122. As such, the static on resistance of the E-FET may be low at the same time that the threshold voltage is high. Further, varying the polarizations of the upper and lower barrier layers 116, 118 and/or the thicknesses $T_1$, $T_2$ of the upper and lower barrier layers 116, 118 advantageously allows control over the static on resistance of the E-FET. For example, increasing the polarization of the upper or lower barrier layer 116, 118 may increase the static on resistance. As another example, increasing the thickness of $T_1$, $T_2$ of the upper or lower barrier layer 116, 118 may increase the static on resistance.

Figure 1B:
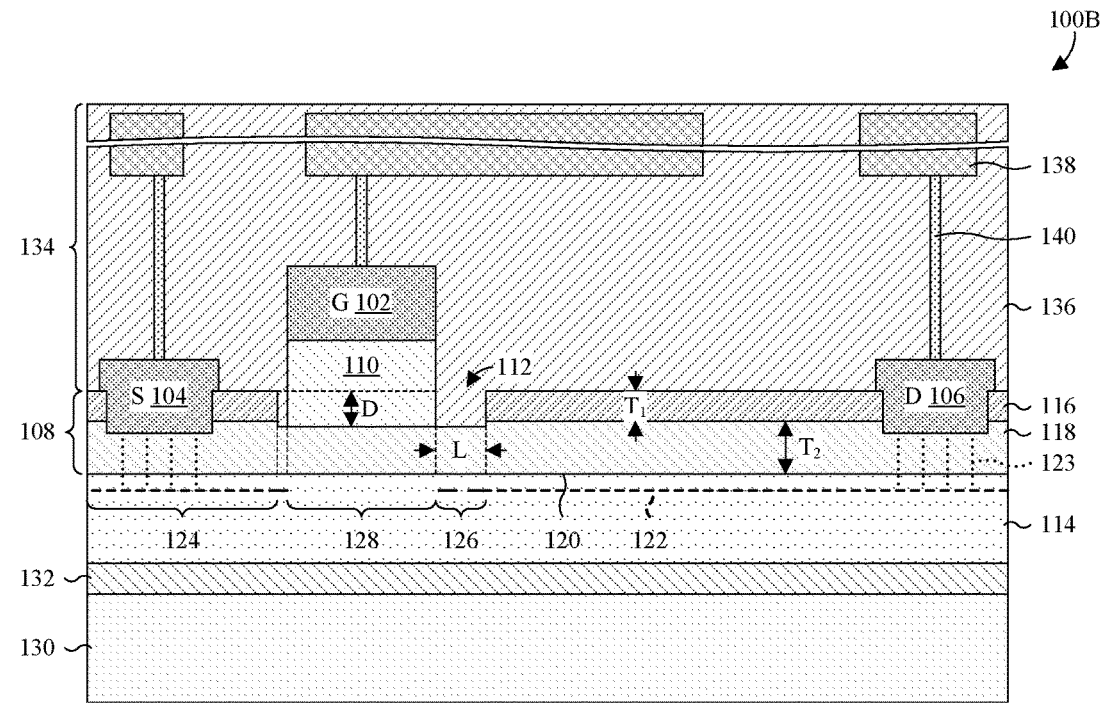
FIG. 1B illustrates a cross-sectional view of some embodiments of an integrated circuit accommodating the E-FET of FIG. 1A.

With reference to FIG. 1B, a cross-sectional view 100B of some embodiments of an integrated circuit accommodating the E-FET of FIG. 1A is provided. As illustrated, a substrate 130 supports the channel layer 114 with a buffer layer 132 arranged between the substrate 130 and the channel layer 114. The substrate 130 is, for example, a silicon carbide substrate, a mono-crystalline silicon substrate, or a sapphire substrate. The buffer layer 132 is configured to isolate the substrate 130 from the channel layer 114, and to transition between a lattice constant of the substrate 130 and a lattice constant of the channel layer 114. The buffer layer 132 is or otherwise includes, for example, aluminum nitride or aluminum gallium nitride.

An interconnect structure 134 is arranged over the gate, source, and drain electrodes 102, 104, 106, the composite barrier layer 108, and the gate dielectric layer 110. The interconnect structure 134 comprises an interlayer dielectric (ILD) region 136 that may be, for example, silicon dioxide, a low κ dielectric, or a combination of the foregoing. A low-κ dielectric is a dielectric with a dielectric constant κ less than about 3.9. The interconnect structure 134 further comprises layers of conductive lines 138 and layers of vias 140 that are alternatingly stacked within the ILD region 136. For ease of illustration, only one layer of conductive lines 138 and one layer of vias 140 are shown. The layers of conductive lines 138 electrically couple neighboring layers of vias together. The layers of vias 140 electrically couple neighboring layers of conductive lines together, and further electrically couple a lower layer of conductive lines to the gate, source, and drain electrodes 102, 104, 106. The conductive lines 138 and the vias 140 may be, for example, copper, aluminum copper, aluminum, tungsten, titanium, or a combination of the foregoing.

Figure 2A:
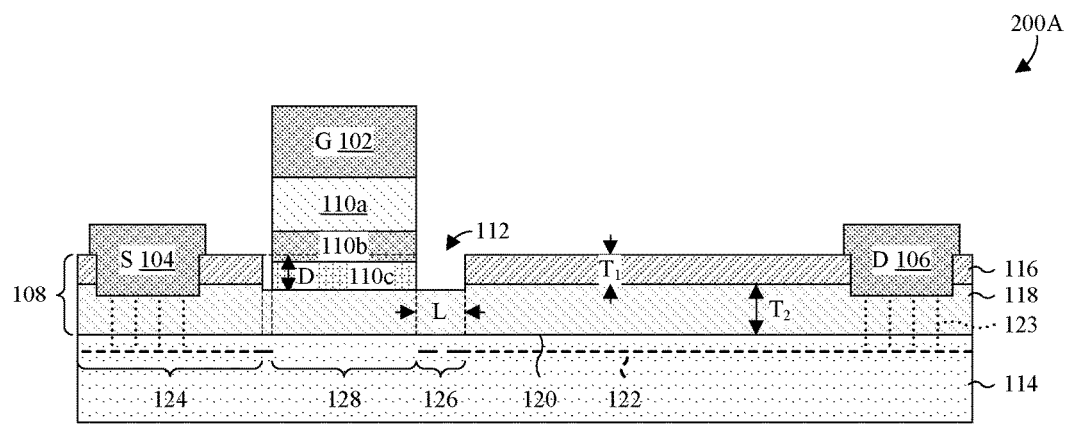
FIG. 2A illustrates a cross-sectional view of other embodiments of the E-FET of FIG. 1A.

With reference to FIG. 2A, a cross-sectional view 200A of other embodiments of the E-FET of FIG. 1A is provided. As illustrated, the E-FET comprises multiple gate dielectric layers 110a, 110b, 110c stacked upon one another to insulate the gate electrode 102 from the composite barrier layer 108. For example, the multiple gate dielectric layers 110a, 110b, 110c may comprise a first gate dielectric layer 110a overlying a second gate dielectric layer 110b and a third gate dielectric layer 110c underlying the second gate dielectric layer 110b. Further, the multiple gate dielectric layers 110a, 110b, 110c are confined to the gate opening 112 with sidewalls laterally spaced from sidewalls of the gate opening 112. In some embodiments, sidewalls of the multiple gate dielectric layers 110a, 110b, 110c are aligned, and/or drain-side sidewalls of the multiple gate dielectric layers 110a, 110b, 110c are farther from a drain-side sidewall of the gate opening 112 than source-side sidewalls of the multiple gate dielectric layers 110a, 110b, 110c are from a source-side sidewall of the gate opening 112. The multiple gate dielectric layers 110a, 110b, 110c comprise a group III nitride, silicon dioxide, silicon nitride, or a combination of the foregoing, and/or are doped with p-type or n-type dopants. For example, the first and third gate dielectric layers 110a, 110c may be p-type GaN, and the second gate dielectric layer 110b may be n-type gallium nitride (n-GaN). Advantageously, the multiple gate dielectric layers 110a, 110b, 110c allow a wide bandgap, low leakage, high performance, and high reliability.

Figure 2B:
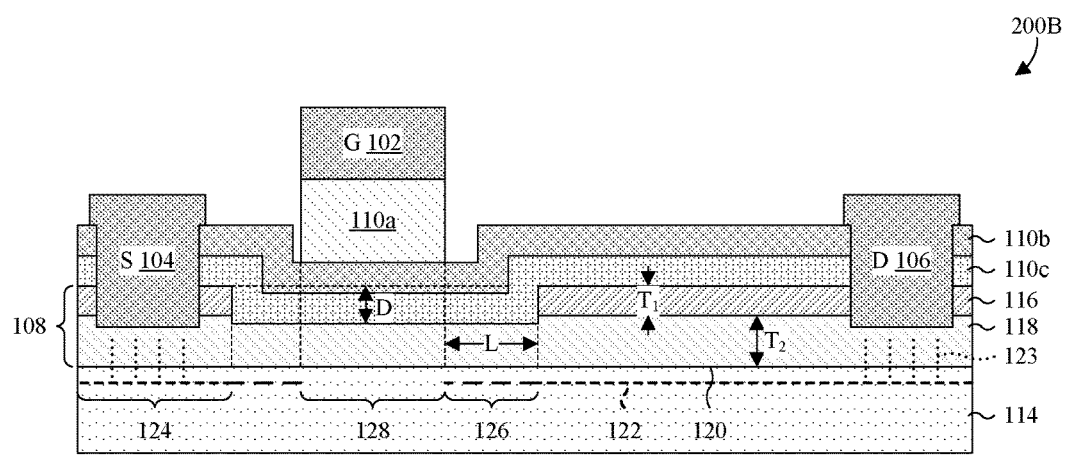
FIG. 2B illustrates a cross-sectional view of other embodiments of the E-FET of FIG. 2A.

With reference to FIG. 2B, a cross-sectional view 200B of other embodiments of the E-FET of FIG. 2A is provided. As illustrated, each of the multiple gate dielectric layers 110a, 110b, 110c, except a topmost one of the multiple gate dielectric layers 110a, 110b, 110c, extends laterally from the source electrode 104 to the drain electrode 106 to conformally line immediately underlying surfaces. Further, the topmost gate dielectric layer is laterally confined to the gate opening 112 (see FIG. 2A) with sidewalls laterally spaced from sidewalls of the gate opening 112, and the source and drain electrodes 104, 106 extend through the multiple gate dielectric layers 110a, 110b, 110c to the composite barrier layer 108.

While FIGS. 2A and 2B were illustrated with three gate dielectric layers 110a, 110b, 110c, it is to be appreciated that more or less gate dielectric layers are amenable. For example, the third gate dielectric layer 110c may be omitted. Also, while not shown, the E-FET of FIG. 2A or FIG. 2B may be arranged within the integrated circuit of FIG. 1B in place of, or in addition to, the E-FET of FIG. 1A. For example, the interconnect structure 134 of FIG. 1B may cover the E-FET of FIG. 2A or 2B, and electrically couple with the gate, source, and drain electrodes 102, 104, 106 of the E-FET by the vias 140 of FIG. 1B. As another example, the substrate 130 of FIG. 1B may support the E-FET of FIG. 2A or 2B with the buffer layer 132 of FIG. 1B arranged between the substrate 130 and the E-FET.

Figure 3:
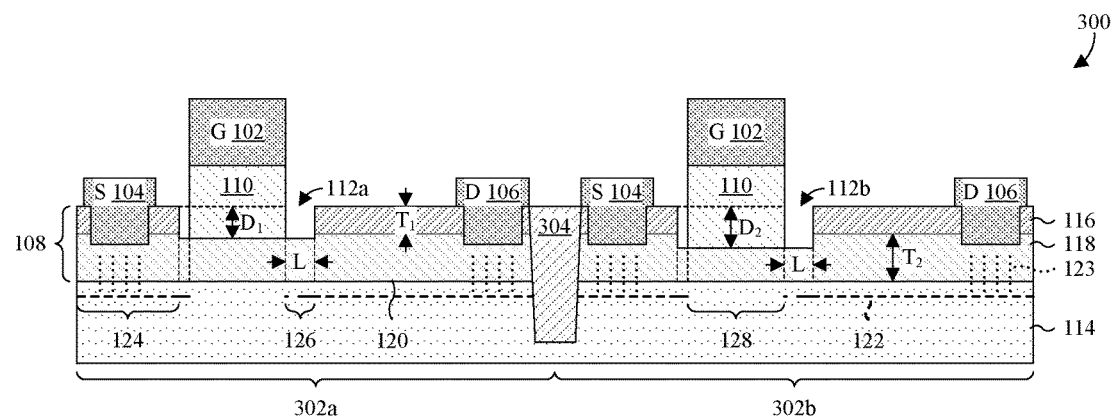
FIG. 3 illustrates a cross-sectional view of some embodiments of a pair of E-FETs respectively with different threshold voltages.

With reference to FIG. 3, a cross-sectional view 300 of some embodiments of a pair of E-FETs 302a, 302b respectively with different threshold voltages is provided. The pair of E-FETs 302a, 302a comprises a first E-FET 302a and a second E-FET 302b laterally spaced and isolated by an isolation region 304. The isolation region 304 extends vertically into the composite barrier layer 108 and the channel layer 114. The isolation region 304 may be, for example, an implant isolation region, a deep trench isolation (DTI) region, or a shallow trench isolation (STI) region.

The first and second E-FETs 302a, 302b are individually configured as described with regards to FIG. 1A. However, the first and second E-FETs 302a, 302b have respective gate openings 112a, 112b extending into the composite barrier layer 108 respectively to different depths $D_1$, $D_2$, such that first and second E-FETs 302a, 302b have different threshold voltages. For example, the depth $D_1$ of the first E-FET 302a may be less than the depth $D_2$ of the second E-FET 302b, such that the threshold voltage of the first E-FET 302a is less than the threshold voltage of the second E-FET 302b. As described above, an increased depth of a gate opening reduces polarization immediately under the gate opening, which decreases electron density, increases resistance, and increases threshold voltage.

While the foregoing was described with regard to two E-FETs, it is to be appreciated that it can be extended to more than two E-FETs. As such, two or more E-FETs may be concurrently formed on a composite barrier layer 108 with multiple different threshold voltages. Also, while the first and second E-FETs 302a, 302b were individually configured as described in FIG. 1A, the first and second E-FETs 302a, 302b may be individually configured as described in FIG. 2A or 2B. Even more, while not shown, the first and second of E-FETs 302a, 302b may be arranged within the integrated circuit of FIG. 1B in place of, or in addition to, the E-FET of FIG. 1A. For example, the interconnect structure 134 may cover the first and second E-FETs 302a, 302b, and electrically couple with the gate, source, and drain electrodes 102, 104, 106 of the first and second E-FETs 302a, 302b by the vias 140 of FIG. 1B. As another example, the substrate 130 of FIG. 1B may support the first and second E-FETs 302a, 302b with the buffer layer 132 of FIG. 1B arranged between the substrate 130 and the first and second E-FETs 302a, 302b.

With reference to FIGS. 4-9, a series of cross-sectional views 400-900 of some embodiments of a method for manufacturing an E-FET for high static performance is provided. The E-FET may, for example, be configured as described in FIG. 1A.

Figure 4:
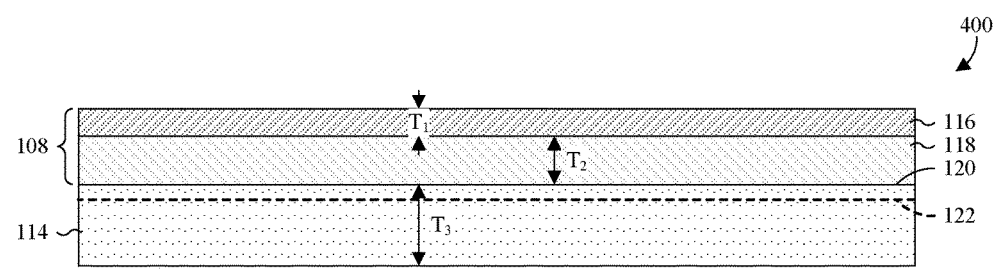
FIGS. 4-9 illustrate a series of cross-sectional views of some embodiments of a method for manufacturing an E-FET for high static performance.

As illustrated by the cross-sectional view 400 of FIG. 4, a channel layer 114 is formed. The channel layer 114 is formed over a substrate (not shown), such as, for example, the substrate 130 in FIG. 1B. Further, the channel layer 114 is formed of a group III-V compound and/or is formed undoped. For example, the channel layer 114 may be formed of u-GaN. In some embodiments, the channel layer is formed by a growth or deposition process, such as, for example, metal-organic chemical vapor deposition (MOCVD), molecular beam epitaxy (MBE), or hydride vapor phase epitaxy (HVPE). Further, in some embodiments, the channel layer 114 is formed at about 905-1050 degrees Celsius and/or with a thickness $T_3$ of about 0.2-1.5 micrometers.

Also illustrated by the cross-sectional view 400 of FIG. 4, a composite barrier layer 108 is formed over the channel layer 114. The composite barrier layer 108 is formed with a lower barrier layer 118 arranged over and contacting the channel layer 114, such that a heterojunction 120 forms at an interface therebetween and a 2-DEG 122 forms along the heterojunction. Further, the composite barrier layer 108 is formed with an upper barrier layer 116 arranged over and, in some embodiments, contacting the lower barrier layer 118. The upper and lower barrier layers 116, 118 are formed with different polarizations, and/or are formed of group III-V nitrides or some other group III-V compounds. For example, the upper barrier layer 116 may be formed with a higher polarization than the lower barrier layer 118, and/or the upper and lower barrier layers 116, 118 may respectively be formed of $In_wAl_xG_{1-x-w}N$ and $In_yAl_zG_{1-y-z}N$, where w, x, y, and z are each between 0 and 1.

In some embodiments, the process for forming the composite barrier layer 108 comprises depositing or growing the lower barrier layer 118 over the channel layer 114 and subsequently depositing or growing the upper barrier layer 116 over the lower barrier layer 118. The upper and lower barrier layers 116, 118 may be deposited or grown by, for example, MOCVD, MBE, HVPE, or some other deposition process. Further, in some embodiments, the upper and lower barrier layers 116, 118 are formed at about 1000-1150 degrees Celsius and/or with individual thickness $T_1$, $T_2$ of about 10-30 nanometers.

Figure 5:
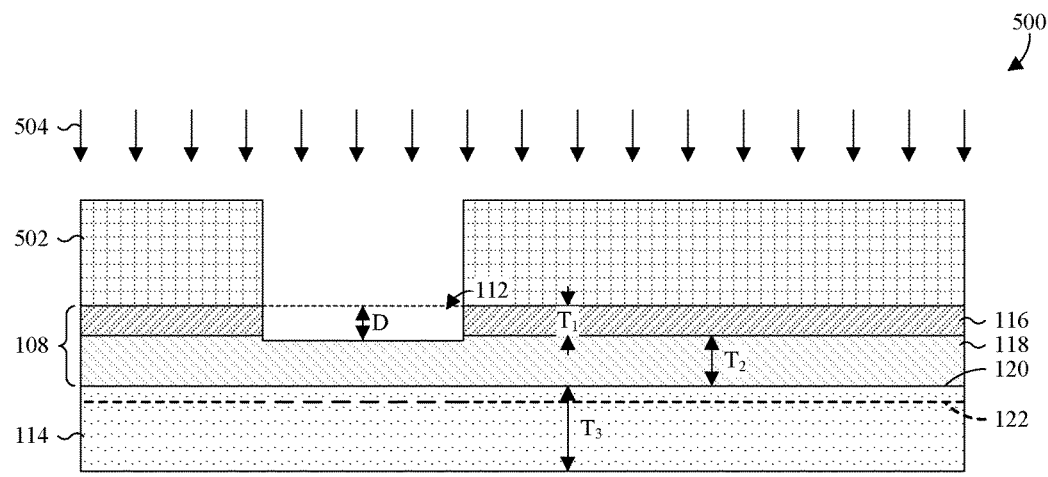

As illustrated by the cross-sectional view 500 of FIG. 5, a first etch is performed into the composite barrier layer 108 to form a gate opening 112. The gate opening 112 is formed with a depth D that advantageously allows control over a threshold voltage of the E-FET under manufacture. For example, increasing the depth D increases the threshold voltage and decreasing the depth D reduces the threshold voltage. As a result of the gate opening 112, polarization of the composite barrier layer 108 is reduced at the gate opening 112, such that the electron density in the 2-DEG 122 is reduced immediately under gate opening 112.

In some embodiments, the process for performing the first etch comprises depositing and patterning a first photoresist layer 502, such that the first photoresist layer 502 laterally surrounds a region of the composite barrier layer 108 corresponding to the gate opening 112. The first photoresist layer 502 may be deposited by, for example, spin coating or vapor deposition, and/or may be patterned by, for example, photolithography. Further, in some embodiments, the process comprises applying one or more first etchants 504 to the first photoresist layer 502 with the first photoresist layer 502 in place, and subsequently stripping the first photoresist layer 502. The first photoresist layer 502 may be stripped by, for example, a wet strip process using a sulfuric acid-hydrogen peroxide mixture (SPM).

Figure 6:
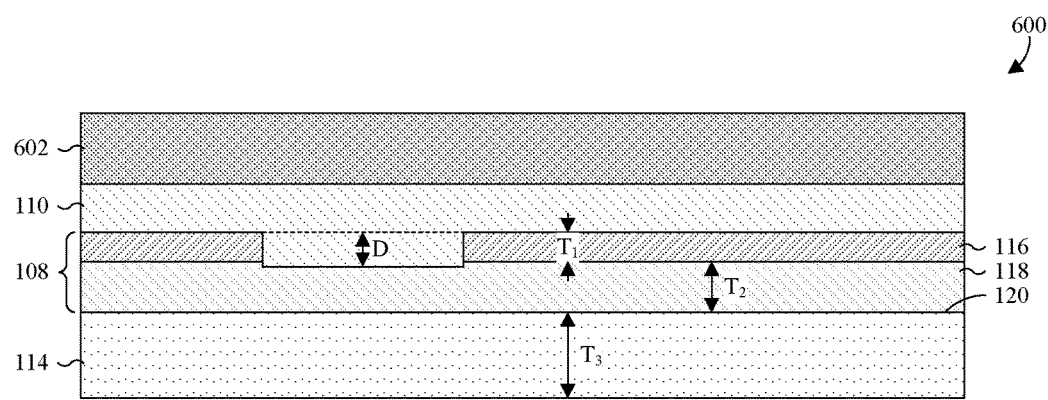

As illustrated by the cross-sectional view 600 of FIG. 6, a gate dielectric layer 110 is formed over the composite barrier layer 108, and is further formed filling the gate opening 112 (see FIG. 5). The gate dielectric layer 110 is formed with a material that depletes the 2-DEG 122 (see FIG. 5) of electrons or otherwise substantially reduces the electron density of the 2-DEG 122. In some embodiments, the gate dielectric layer 110 is formed with a group III nitride and/or is formed doped. For example, the gate dielectric layer 110 may be formed of p-GaN. Further, in some embodiments, the gate dielectric layer 110 is formed with an upper or top surface that is planar and/or is formed conformally.

In some embodiments, the process for forming the gate dielectric layer 110 comprises depositing or growing the gate dielectric layer 110 over the composite barrier layer 108 and filing the gate opening 112. The gate dielectric layer 110 may, for example, be deposited or grown by, for example, chemical vapor deposition (CVD), MOCVD, sputtering, MBE, HVPE, or electron beam/thermal evaporation. Further, the gate dielectric layer 110 may, for example, be deposited or grown at about 1000-1150 degrees Celsius and/or with a thickness of about 10-200 nanometers. In some embodiments, the process further comprises performing a planarization into the upper or top surface of the gate dielectric layer 110. The planarization may, for example, be performed with chemical mechanical polishing (CMP).

Also illustrated by the cross-sectional view 600 of FIG. 6, a first conductive layer 602 is formed over the gate dielectric layer 110. In some embodiments, the first conductive layer 602 is formed with an upper or top surface that is planar, and/or is formed of copper, aluminum copper, tungsten, or some other conductive material.

In some embodiments, the process for forming the first conductive layer 602 comprises depositing or growing the first conductive layer 602. The first conductive layer 602 may be deposited or grown by, for example, CVD or electrochemical plating (ECP). Further, in some embodiments, the process for forming the first conductive layer 602 comprises performing a planarization into the upper or top surface of the first conductive layer 602.

Figure 7:
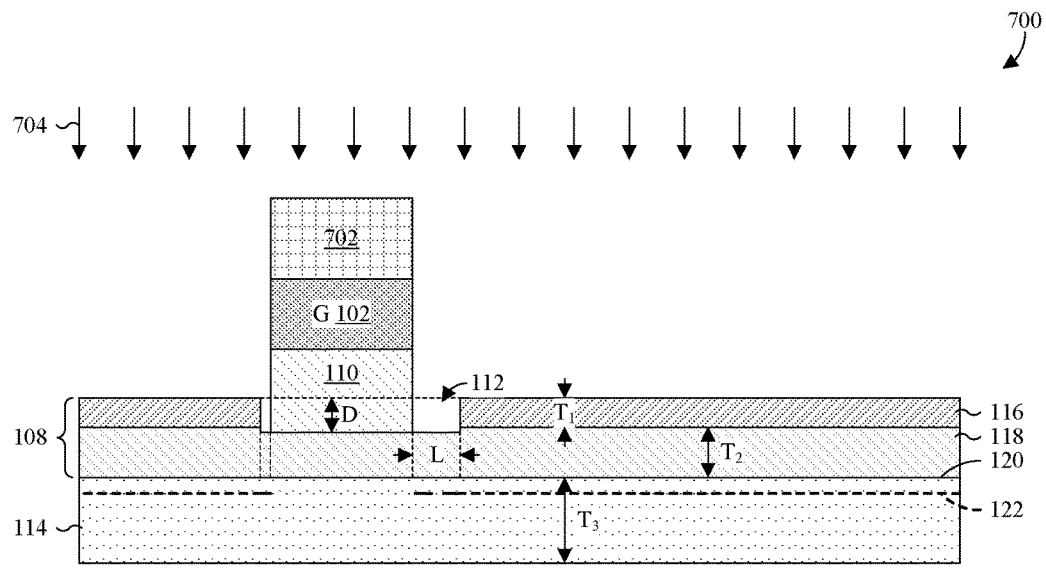

As illustrated by the cross-sectional view 700 of FIG. 7, a second etch is performed into the gate dielectric layer 110 and the first conductive layer 602 (see FIG. 6). The second etch forms a gate electrode 102 spaced over the composite barrier layer 108 by the gate dielectric layer 110, and confined to directly over the gate opening 112. The gate electrode 102 is further formed spaced from sidewalls of the gate opening 112 and, in some embodiments, spaced farther from a drain-side sidewall of the gate opening 112 than a source-side sidewall of the gate opening 112. For example, the gate electrode 102 may be spaced from the drain-side sidewall of the gate opening 112 by a lateral distance L that is greater than a corresponding distance between the gate electrode 102 and the source-side sidewall of the gate opening 112

In addition to forming the gate electrode 102, the second etch also removes peripheral regions of the gate dielectric layer 110 uncovered by the gate electrode 102. By removing the peripheral regions of the gate dielectric layer 110, the gate dielectric layer 110 is confined to the gate opening 112 and has sidewalls aligned to sidewalls of the gate electrode 102. Further, by removing the peripheral regions of the gate dielectric layer 110, the 2-DEG 122 reforms where the peripheral regions were.

In some embodiments, the process for performing the second etch comprises depositing and patterning a second photoresist layer 702, such that the second photoresist layer 702 masks a region of the first conductive layer 602 corresponding to the gate electrode 102. Further, in some embodiments, the process comprises applying one or more second etchants 704 to the gate dielectric layer 110 and the first conductive layer 602 with the second photoresist layer 702 in place, and subsequently stripping the second photoresist layer 702.

Figure 8:
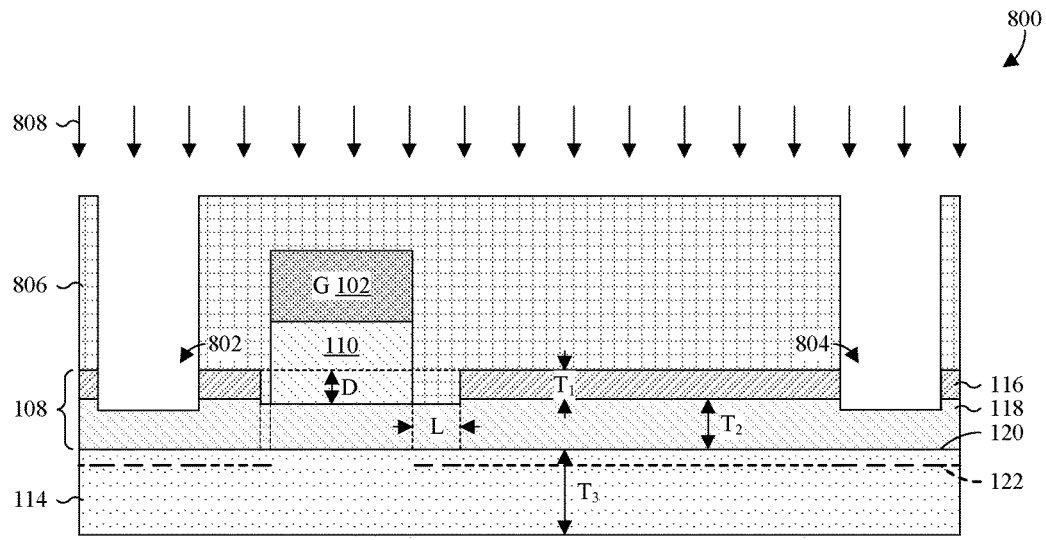

As illustrated by the cross-sectional view 800 of FIG. 8, a third etch is performed into the composite barrier layer 108 to form a source opening 802 and a drain opening 804. The source and drain openings 802, 804 are formed laterally spaced and respectively on opposite sides of the gate opening 112 (see FIG. 7). Further, in some embodiments, the drain opening 804 is formed farther from the gate opening 112 than the source opening 802 is from the gate opening 112. The source and drain openings 802, 804 reduce the polarization of the composite barrier layer 108 at the source and drain openings 802, 804, such that the electron density of the 2-DEG 122 is reduced immediately under the source and drain openings 802, 804.

In some embodiments, the process for performing the third etch comprises depositing and patterning a third photoresist layer 806, such that the third photoresist layer 806 laterally surrounds regions of the composite barrier layer 108 that correspond to the source and drain openings 802, 804. Further, in some embodiments, the process comprises applying one or more third etchants 808 to the composite barrier layer 108 with the third photoresist layer 806 in place, and subsequently stripping the third photoresist layer 806.

Figure 9:
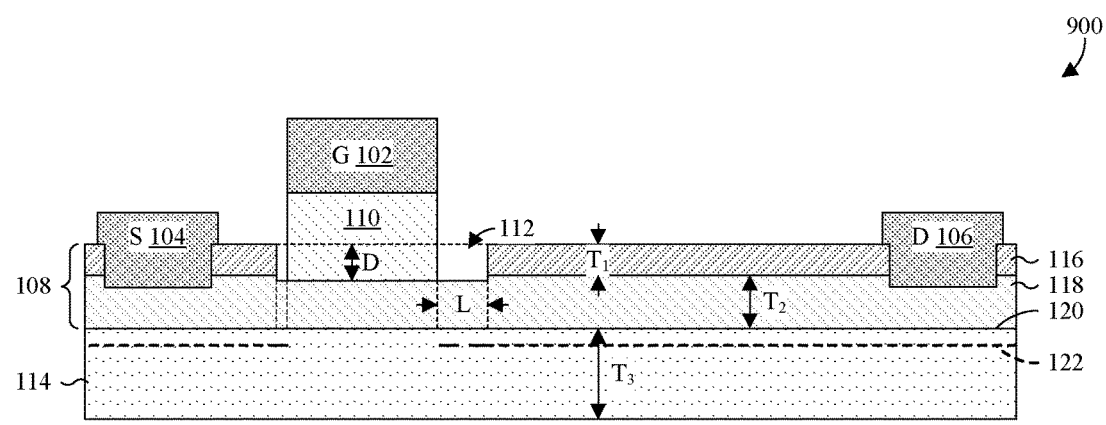

As illustrated by the cross-sectional view 900 of FIG. 9, a source electrode 104 and a drain electrode 106 are respectively formed in the source and drain openings 802, 804 (see FIG. 8). In some embodiments, the process for forming the source and drain electrodes 104, 106 comprises forming a second conductive layer, and subsequently performing a fourth etch into the second conductive layer to form the source and drain electrodes 104, 106 from the second conductive layer. The second conductive layer may be formed with, for example, an upper or top surface that is planar, and/or maybe formed with a polarization compensating for regions of the composite barrier layer 108 removed during the formation of the source and drain openings 802, 804. Further, the second conductive layer may be formed of, for example, copper, aluminum copper, tungsten, or a combination of the foregoing.

In some embodiments, the process for forming the second conductive layer comprises depositing or growing the second conductive layer over the composite barrier layer 108 and filling the source and drain openings 802, 804 (see FIG. 8). The second conductive layer may be deposited or grown by, for example, vapor deposition or ECP. Further, in some embodiments, the process for forming the second conductive layer comprises performing a planarization into the upper or top surface of the second conductive layer. The planarization may be performed by, for example, CMP.

Further, in some embodiments, the process for performing the fourth etch comprises depositing and patterning a fourth photoresist layer, such that the fourth photoresist layer masks regions of the second conductive layer corresponding to the source and drain electrodes 104, 106. Further, in some embodiments, the process comprises applying one or more fourth etchants to the second conductive layer with the fourth photoresist layer in place, and subsequently stripping the fourth photoresist layer.

Figure 10:
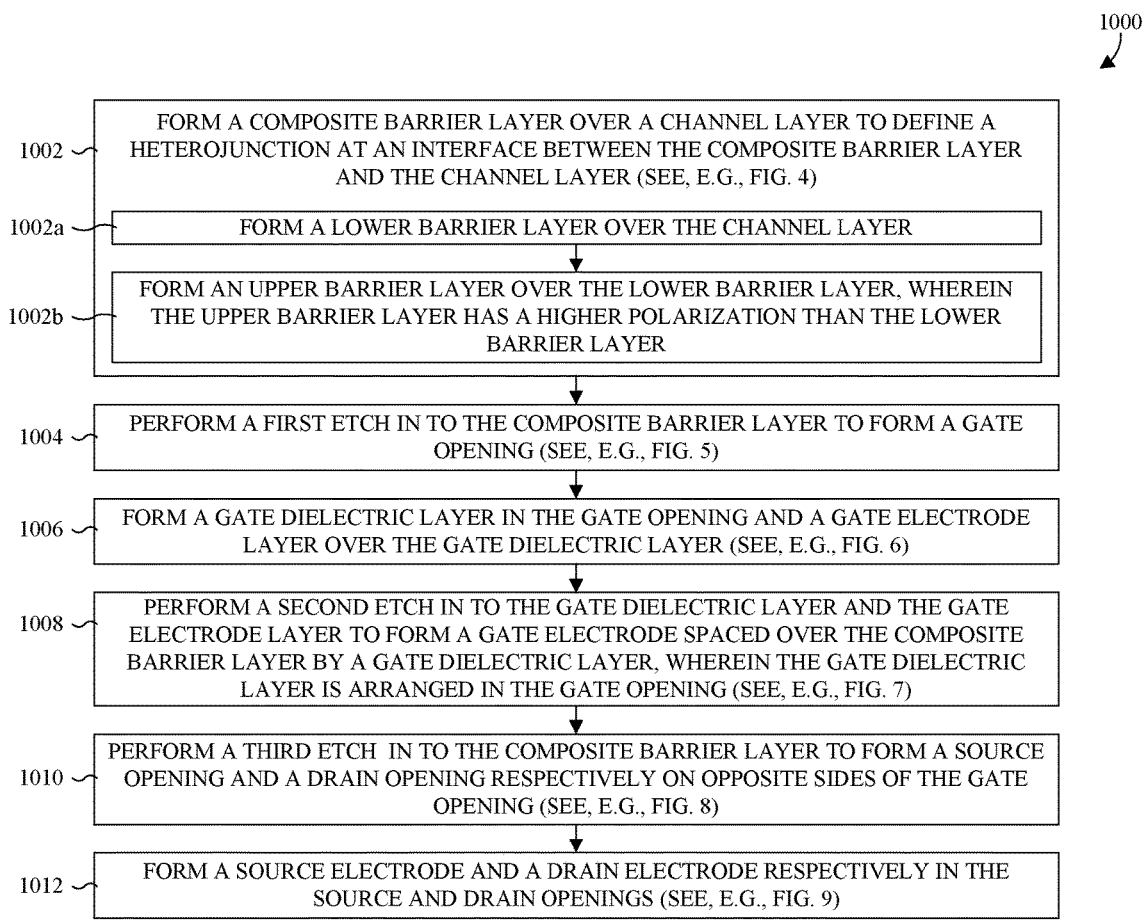
FIG. 10 illustrates a flowchart of some embodiments of the method of FIGS. 4-9.

With reference to FIG. 10, a flowchart 1000 of some embodiments of the method of FIGS. 4-9 is provided.

At 1002, a composite barrier layer is formed over a channel layer to define a heterojunction at an interface between the composite barrier layer and the channel layer. See, for example, FIG. 4. Forming the composite barrier layer comprises forming a lower barrier layer over the channel layer at 1002a. Further, forming the composite barrier layer comprises forming an upper barrier layer over the lower barrier layer at 1002b, wherein the upper barrier layer has a higher polarization than the lower barrier layer.

At 1004, a first etch is performed in to the composite barrier layer to form a gate opening. See, for example, FIG. 5.

At 1006, a gate dielectric layer is formed in the gate opening and a gate electrode layer is formed over the gate dielectric layer. See, for example, FIG. 6.

At 1008, a second etch is performed in to the gate dielectric layer and the gate electrode layer to form a gate electrode spaced over the composite barrier layer by a gate dielectric layer, wherein the gate dielectric layer is arranged in the gate opening. See, for example, FIG. 7.

At 1010, a third etch is performed into the composite barrier layer to form a source opening and a drain opening respectively on opposite sides of the gate opening. See, for example, FIG. 8.

At 1012, a source electrode and a drain electrode are respectively formed in the source and drain openings. See, for example, FIG. 9.

While the method described by the flowchart 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, in some embodiments, the present disclosure provides an enhancement mode transistor. A composite barrier layer comprises a lower barrier layer and an upper barrier layer. The upper barrier layer is arranged over the lower barrier layer and has a different polarization than the lower barrier layer. Further, the composite barrier layer comprises a gate opening. A channel layer is arranged under the composite barrier layer, such that a heterojunction is defined at an interface between the channel layer and the composite barrier layer. A gate dielectric layer is arranged over the composite barrier layer and within the gate opening. A gate electrode is arranged over the gate dielectric layer.

In other embodiments, the present disclosure provides a method for manufacturing an enhancement mode transistor. A lower barrier layer is formed over a channel layer to define a heterojunction at an interface between the lower barrier layer and the channel layer. An upper barrier layer is formed over the lower barrier layer, wherein the upper barrier layer has a different polarization than the lower barrier layer. A first etch is performed into the upper barrier layer to define a gate opening. A gate electrode is formed spaced over the upper or lower barrier layer by a gate dielectric layer arranged in the gate opening.

In yet other embodiments, the present disclosure provides a pair of enhancement mode transistors. A composite barrier layer comprises a lower barrier layer and an upper barrier layer arranged over the lower barrier layer, wherein the lower and upper barrier layers have different polarizations. Further, the composite barrier layer comprises a first gate opening and a second gate opening, wherein the first and second gate openings extend into the composite barrier layer to different depths. A channel layer is arranged under the composite barrier layer, such that a heterojunction is defined at an interface between the channel layer and the composite barrier layer. A first gate electrode and a second gate electrode are respectively spaced over the first and second gate openings respectively by a first gate dielectric layer and a second gate dielectric layer. Further, the first and second gate dielectric layers are respectively arranged in the first and second gate openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An enhancement mode transistor comprising:
    a composite barrier layer comprising a lower barrier layer and an upper barrier layer, wherein the upper barrier layer is arranged over the lower barrier layer and has a different polarization than the lower barrier layer, and wherein the composite barrier layer further comprises a gate opening;
    a channel layer arranged under the composite barrier layer, such that a heterojunction is defined at an interface between the channel layer and the composite barrier layer;
    a gate dielectric layer arranged over the composite barrier layer and within the gate opening;
    a gate electrode arranged over the gate dielectric layer;
    a source electrode arranged to a first side of the gate dielectric layer; and
    a drain electrode arranged to a second side of the gate dielectric layer;
    wherein the gate opening has a first length between the first side of the gate dielectric layer and a first side of the upper barrier layer nearest the first side of the gate dielectric layer, and wherein the gate opening has a second length between a second side of the gate dielectric layer and a second side of the upper barrier layer nearest the second side of the gate dielectric layer, the second length differing from the first length.

2. The enhancement mode transistor according to claim 1, wherein a polarization of the upper barrier layer is greater than a polarization of the lower barrier layer.

3. The enhancement mode transistor according to claim 1, wherein a bottom surface of the gate opening is defined by, or recessed below, a top surface of the lower barrier layer.

4. The enhancement mode transistor according to claim 3, wherein a bottom surface of the gate dielectric layer contacts the bottom surface of the gate opening.

5. The enhancement mode transistor according to claim 1, wherein the gate dielectric layer is a group III nitride.

6. The enhancement mode transistor according to claim 1, wherein the gate opening is laterally spaced farther from the drain electrode than the source electrode.

7. The enhancement mode transistor according to claim 1, further comprising:
    an additional gate dielectric layer arranged over and conformally lining the composite barrier layer laterally from the source electrode to the drain electrode, wherein the source and drain electrodes extend through the additional gate dielectric layer, and wherein the gate dielectric layer is arranged over the additional gate dielectric layer and entirely between opposite sidewalls of the gate opening.

8. The enhancement mode transistor according to claim 1, wherein the gate dielectric layer is arranged entirely between opposite sidewalls of the gate opening.

9. The enhancement transistor according to claim 1, wherein the upper barrier layer has an uppermost surface, and the gate dielectric layer has an uppermost surface arranged at a first height over the uppermost surface of the upper barrier layer.

10. A pair of enhancement mode transistors comprising:
    a composite barrier layer comprising a lower barrier layer and an upper barrier layer arranged over the lower barrier layer, wherein the lower and upper barrier layers have different polarizations, wherein the composite barrier layer further comprises a first gate opening and a second gate opening, and wherein the first and second gate openings extend into the composite barrier layer to different depths;
    a channel layer arranged under the composite barrier layer, such that a heterojunction is defined at an interface between the channel layer and the composite barrier layer; and
    a first gate electrode and a second gate electrode respectively spaced over the first and second gate openings respectively by a first gate dielectric layer and a second gate dielectric layer, wherein the first and second gate dielectric layers are respectively arranged in the first and second gate openings, and wherein the first and second gate electrodes extend to different depths beneath an uppermost surface of the lower barrier layer.

11. The pair of enhancement mode transistors according to claim 10, wherein a polarization of the upper barrier layer is greater than a polarization of the lower barrier layer.

12. The pair of enhancement mode transistors according to claim 10, wherein the first gate electrode and the first gate dielectric layer are arranged entirely between opposite sidewalls of the first gate opening.

13. The pair of enhancement mode transistors according to claim 12, wherein the first gate electrode and the first gate dielectric layer are spaced from the opposite sidewalls.

14. The pair of enhancement mode transistors according to claim 12, wherein the first gate electrode and the first gate dielectric layer are closer to a source-side one of the opposite sidewalls than a drain-side one of the opposite sidewalls.

15. The pair of enhancement mode transistors according to claim 10, wherein a bottom surface of the first gate opening and a bottom surface of the second gate opening are defined by the lower barrier layer.

16. The pair of enhancement mode transistors according to claim 10, wherein the first and second gate dielectric layers are a group III nitride.

17. The pair of enhancement mode transistors according to claim 10, wherein the upper barrier layer covers and contacts the lower barrier layer, and wherein the first and second gate dielectric layers contact the lower barrier layer respectively in the first and second gate openings.

18. The pair of enhancement transistors according to claim 10, wherein the upper barrier layer has an uppermost surface, and at least one of the first gate dielectric layer and the second gate dielectric layer has an uppermost surface arranged at a first height over the uppermost surface of the upper barrier layer.

19. An enhancement mode transistor comprising:
a composite barrier layer comprising a lower barrier layer and an upper barrier layer, wherein the upper barrier layer overlies and contacts the lower barrier layer, wherein the upper barrier layer has a different polarization than the lower barrier layer, and wherein the composite barrier layer further comprises a gate opening extending through the upper barrier layer to expose the lower barrier layer;
a source electrode and a drain electrode respectively on opposite sides of the gate opening and laterally spaced from the gate opening;
a channel layer under the composite barrier layer, such that a heterojunction is defined at an interface between the channel layer and the composite barrier layer, wherein an upper surface of the channel layer is separated from the source electrode and the drain electrode by the lower barrier layer;
a gate dielectric layer over and contacting the lower barrier layer, wherein the gate dielectric layer contacts the lower barrier layer within the gate opening, and wherein the gate dielectric layer has a first gate dielectric sidewall nearest the source electrode and a second gate dielectric sidewall nearest the drain electrode, wherein the upper barrier layer has a first upper barrier sidewall nearest the source electrode and a second upper barrier sidewall nearest the drain electrode, wherein the first gate dielectric sidewall is spaced apart from the first upper barrier sidewall by a first distance, and the second gate dielectric sidewall is spaced apart from the second upper barrier sidewall by a second distance that differs from the first distance; and
a gate electrode over and contacting the gate dielectric layer.

20. The enhancement mode transistor according to claim 19, wherein the channel layer has a first electron density directly under the gate dielectric, wherein the channel layer has a second electron density between the first upper barrier sidewall and the source electrode, wherein the channel layer has a third electron density between the second gate dielectric sidewall and the second upper barrier sidewall, and wherein the first, second and third electron densities are different.

* * * * *